(12) United States Patent
Chhor et al.

(10) Patent No.: US 7,806,324 B1
(45) Date of Patent: Oct. 5, 2010

(54) METHODS OF MAKING AND USING MEMORY CARD WITH ENHANCED TESTABILITY

(75) Inventors: Khushrav S. Chhor, Fremont, CA (US); Tae-Hee Lee, Saratoga, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 12 days.

(21) Appl. No.: 12/019,161

(22) Filed: Jan. 24, 2008

Related U.S. Application Data

(62) Division of application No. 09/788,864, filed on Feb. 20, 2001, now Pat. No. 7,352,199.

(51) Int. Cl.
*G06K 5/00* (2006.01)
(52) U.S. Cl. ............... 235/380; 235/486; 235/492; 713/185
(58) Field of Classification Search ........... 235/380, 235/486, 492; 711/185
See application file for complete search history.

(56) References Cited

U.S. PATENT DOCUMENTS

| | | | | |
|---|---|---|---|---|
| 5,561,628 | A * | 10/1996 | Terada et al. | 365/185.04 |
| 6,003,100 | A * | 12/1999 | Lee | 710/301 |
| 6,573,567 | B1 * | 6/2003 | Nishizawa et al. | 257/358 |
| 6,686,663 | B2 * | 2/2004 | Masuda et al. | 257/777 |
| 7,306,160 | B2 * | 12/2007 | Takiar et al. | 235/492 |
| 2005/0105360 | A1 * | 5/2005 | Takiar et al. | 365/222 |

* cited by examiner

*Primary Examiner*—Charles D Garber
*Assistant Examiner*—Stanetta D Isaac
(74) *Attorney, Agent, or Firm*—Vierra Magen Marcus & DeNiro LLP

(57) ABSTRACT

By decreasing the amount of card substrate required in a memory card to support the actual memory unit, the test interface of the card, which is usually removed before final assembly of the card, can be brought within the allowable length of the finished card and can, therefore, remain on the card permanently. Consequently, in the event of a field failure, the test interface remains available for testing the card and diagnosing the location and cause of the failure.

22 Claims, 7 Drawing Sheets

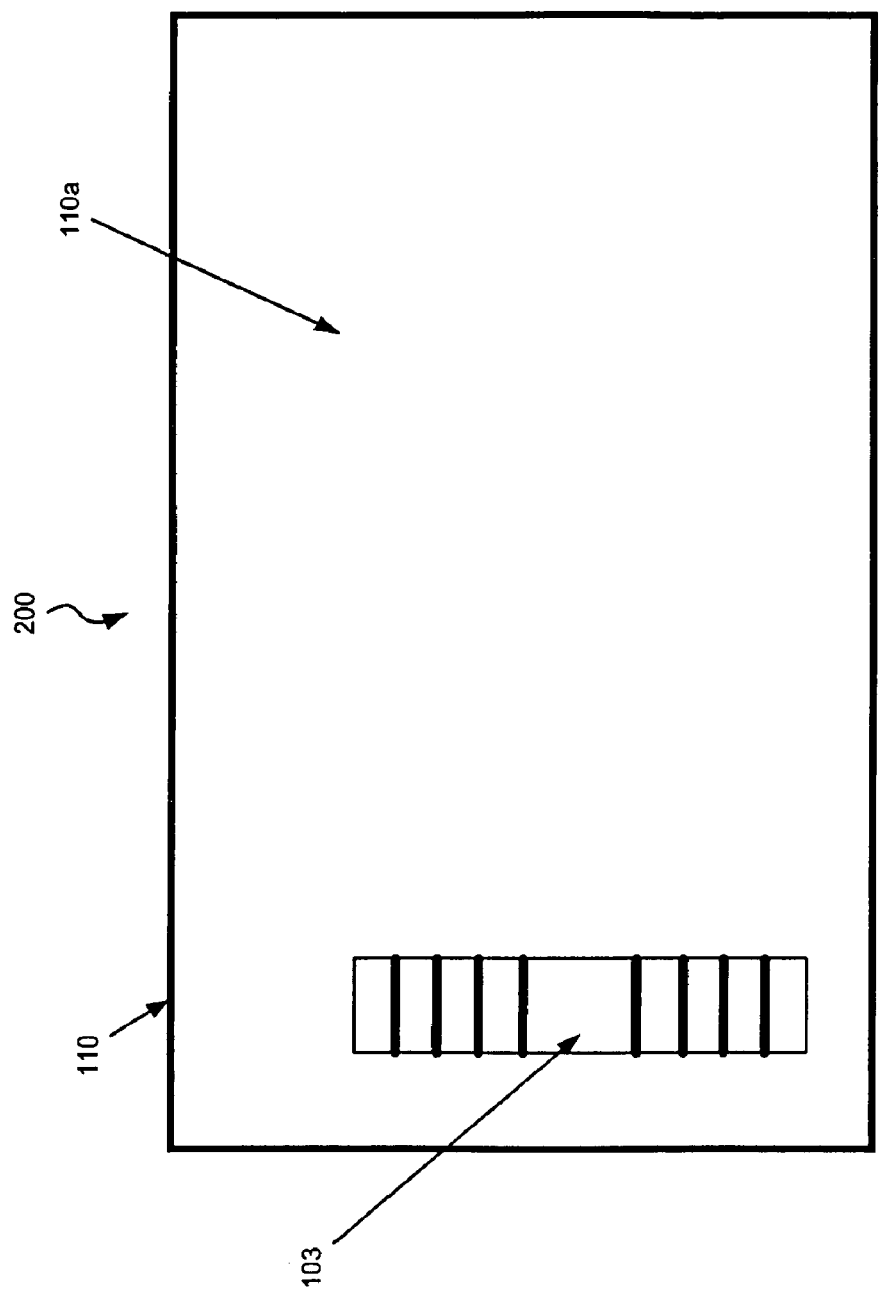

METHODS OF MAKING AND USING MEMORY CARD WITH ENHANCED TESTABILITY

PRIORITY CLAIM

The present application is a divisional application from prior U.S. patent application Ser. No. 09/788,864 filed Feb. 20, 2001.

BACKGROUND OF THE INVENTION

1. Field of the Invention

The present invention relates to the field of semiconductor memory cards that can be used to extend the memory available to a wide variety of electronic devices that capture or use electronic data. More specifically, the present invention relates to a memory card with enhanced testability so that upon failure, particularly a failure in the field, the card can be examined and tested so that the source of or reason for, the failure can be identified to improve the reliability and quality of subsequently manufactured cards.

2. Description of the Related Art

Memory cards are flat memory units that incorporate semiconductor memory in a casing called a skin. A memory card may be about the size of a postage stamp, a matchbook or a credit card. Memory cards also include electrical contacts or connectors so that the memory in the card can be connected to a device that captures or uses digital data, for example, a digital camera. In this way, memory cards provide primary or additional memory capacity for the host device in much the same way that floppy disks provide additional memory capacity for computers.

Memory cards are typically non-volatile, meaning that they do not require power to maintain the data stored on them. Memory cards are also solid-state, semiconductor devices. Consequently, there are no moving parts to skip or break down while the stored data is being retrieved. Memory cards offer relatively high storage capacity, recently 32 to 64 MB. Capacities of up to 128 MB and 256 MB are expected in the near future. Memory cards also provide fast data transfer rates, security features and easy storage of data given the small size of the cards.

Memory cards can be used with, for example, digital cameras, music players known as MP3 players, personal digital assistants, game machines, wireless telephones, digital voice recorders, printers and other computer peripherals. Memory cards can also be placed in adapters and interfaced with personal computers like other computer memory cards.

There are many examples of memory cards that conform to different standards. Examples of memory cards include Secure Digital ("SD") memory cards made by Matsushita, Toshiba and SanDisk Corporation; Multi-Media Cards ("MMC"); SmartMedia™ or SSFDC made by Toshiba; CompactFlash™ ("CF") cards produced by SanDisk Corporation and Memory Stick® produced by Sony Corporation. The standards for different types of cards are usually set by industry associations. Information about memory cards and the associations that establish standards can be found at the following websites: http://www.sdcard.org; http://www.compactflash.org; and http://www.ssfdc.or.jp/englishlindex.htm.

FIG. 1a illustrates a block diagram of a generalized memory card (100) during the process of manufacturing the card. As shown in FIG. 1a, the typical memory card (100) includes, of course, a memory unit (102). The bulk of the memory card's real estate is used by the memory unit (102). A controller (101) may also be provided for controlling the storing of data to and the retrieval of information from the memory unit (102).

A main interface (103) electrically connects the components on the card (100) with whatever host device the card (100) is being used with. The main interface (103) typically includes a number, e.g. eight, of pins or contact pads that are brought into contact with, and thus electrically connected to, the data lines of the host device (not shown).

The various elements of the memory card (100) are formed on a substrate (109). The substrate (109) may be a printed circuit board or a semiconductor chip. The elements of the memory card, particularly the memory unit or units can be formed or mounted on one or both sides of the substrate (109).

As shown in FIG. 1a, access to the memory unit (102), via the main interface (103) is through the controller (101). During manufacture, a second interface, called the test interface (104) is formed on the substrate (109). The test interface (104) provides a direct connection (106) to the memory unit (102) as well as a direct connection (105) to the controller (101). Consequently, the test interface (104) provides more direct access to the components of the memory card (100) than is provided through the main interface (103).

As the card (100) is completed, the test interface (104) of the card (100) can be inserted into a slot or socket of testing equipment, such as a test computer. The test computer can then access and test the various components on the card (100) to enhance quality and reliability.

Because each type of memory card (100) can be used with different devices, there must be some standard for, at least, the various types of cards. Consequently, as mentioned above, industry associations or particular manufacturers set various standards for types of memory cards.

As shown in FIG. 1a, the permissible length for the card (100) given the applicable standards is illustrated as length (107). In order to maximize the memory capacity of the card (100), as much of this length as possible may be devoted to the memory unit (102). In fact, as shown in FIG. 1a, the test interface (104) extends a length (108) beyond the allowed length (107) of the card.

Consequently, as shown in FIG. 1b, once testing of the card (100) is completed, the test interface (104) is severed from the card (100). Molding may then be used to complete the components on the card (100), and the card (100) is then encased in a casing (110) known as a "skin." The skin may be made, for example, of plastic or metal.

Problems, however, may still arise on the card (100). For example, a connection on the card (100) may fail or become broken, memory cells in the memory unit (102) may malfunction, or the controller (101) may malfunction. Any of these malfunctions may be caused by defects in the manufacturing process. Additionally, if a new circuit design is being implemented in a card (100), there may be bugs in the design that have gone undiscovered until the design is implemented.

Consequently, it is extremely useful to card manufacturers to be able to ascertain the location and, ultimately, the cause of any failure in the card (100). However, once the card (100) has been encased in the skin (110) and placed in service, the test interface (104) is gone and the card can only be tested by less direct methods using the main interface (103). Thus, what is called a "field failure" or a failure of the card (100) in the field when it is in use, can be very difficult to diagnose.

Consequently, there is a need in the art for an improved means of testing memory cards and diagnosing memory card failures, particularly after the card has been placed in service, i.e. a field failure.

SUMMARY OF THE INVENTION

The present invention meets the above-described needs and others. Specifically, the present invention provides an improved means of testing memory cards and diagnosing memory card failures, particularly after the card has been placed in service, i.e. a field failure.

Additional advantages and novel features of the invention will be set forth in the description which follows or may be learned by those skilled in the art through reading these materials or practicing the invention. The advantages of the invention may be achieved through the means recited in the attached claims.

The present invention may be embodied and described as a memory card composed of a substrate bearing a memory unit; a skin enclosing the substrate; a main interface disposed on the substrate; and a test interface, separate from the main interface, also disposed on the substrate. With the test interface remaining on the memory card after the card is encased in the skin, the skin can be opened to provide access to the test interface for optimal testing of the memory card, even following a field failure.

A molded material required to complete the components on the substrate is preferably molded so that the test interface protrudes from the molded material to form an edge connector. The skin also includes an opening exposing the main interface so that the memory card can be used by a host device to which it is connected.

Preferably, the memory card of the present invention also includes direct connections between a controller on the substrate and the test interface. At least one electrical connection also runs directly between the test interface and the memory unit. In this way, the test interface has better access to the controller and memory unit for testing those components than would be available through the main interface. Alternatively, the controller may be integrated with either the memory unit or the host device.

At least one electrical connection is also formed directly between the main interface and the memory unit. This connection is also electrically connected to the test interface to provide further testing capabilities. In addition to these connections, the memory card also preferably includes at least one electrical connection running between the memory unit and the controller on the substrate. This electrical connection is also connected to the test interface.

The present invention also encompasses the methods of making and using the memory card described above. Specifically, the present invention encompasses a method of making a memory card by enclosing a substrate of the memory card in a skin of the memory card without removing a test interface from the substrate. In other words, the present invention encompasses a method of making a memory card by enclosing a substrate of the memory card in a skin of the memory card, where the substrate enclosed by the skin includes a memory unit, a main interface and a test interface, separate from the main interface.

The present invention also encompasses the method of testing the memory card described above, particularly after a field failure. Specifically, the present invention encompasses a method of testing a memory card by opening the skin of the memory card to expose an edge connector on a substrate of the memory card, the edge connector being separate from a main interface of the memory card; and connecting the edge connector to test equipment for testing the memory card.

BRIEF DESCRIPTION OF THE DRAWINGS

The accompanying drawings illustrate preferred embodiments of the present invention and are a part of the specification. Together with the following description, the drawings demonstrate and explain the principles of the present invention.

FIG. 4 illustrates the main interface of the card of FIG. 3 which is accessible through an opening in the skin.

Throughout the drawings, identical elements are designated by identical reference numbers.

DETAILED DESCRIPTION OF THE PREFERRED EMBODIMENTS

The present invention is an improved memory card which provides better means for testing the card following a failure, particularly a field failure, to improve subsequently manufactured memory cards. As described above, memory cards are solid-state, semiconductor devices that provide primary or additional memory for electronic devices that use digital data. Memory cards are typically non-volatile, meaning that they do not require power to maintain the data stored on them. However, within the scope of the present invention, memory cards may be volatile memory that could be used, for example, to increase the memory on a laptop or personal digital assistant.

The present invention can make use of several earlier inventions which, like the present invention, are owned by SanDisk Corporation, f/k/a Matrix Semiconductor, Inc, e.g., U.S. Pat. Nos. 6,034,882; 6,185,122; 6,420,215; 6,653,712; and 7,091,529 (all incorporated herein by reference in their entireties). As described and claimed in these patents, it is possible to fabricate multiple layers of memory that are stacked vertically in, for example, a memory card. Consequently, the memory capacity of the card can be increased while at the same time decreasing the X-Y real estate required for the memory unit on the card's substrate.

Using the drawings, the preferred embodiments of the present invention will now be explained. Stated generally, by decreasing the amount of the card substrate required to support the memory unit, the test interface of the card can be brought within the allowable length of the finished card and can, therefore, remain on the card permanently. Consequently, in the event of a field failure, the test interface remains available for testing the card and diagnosing the location and cause of the failure.

Figure 1A:
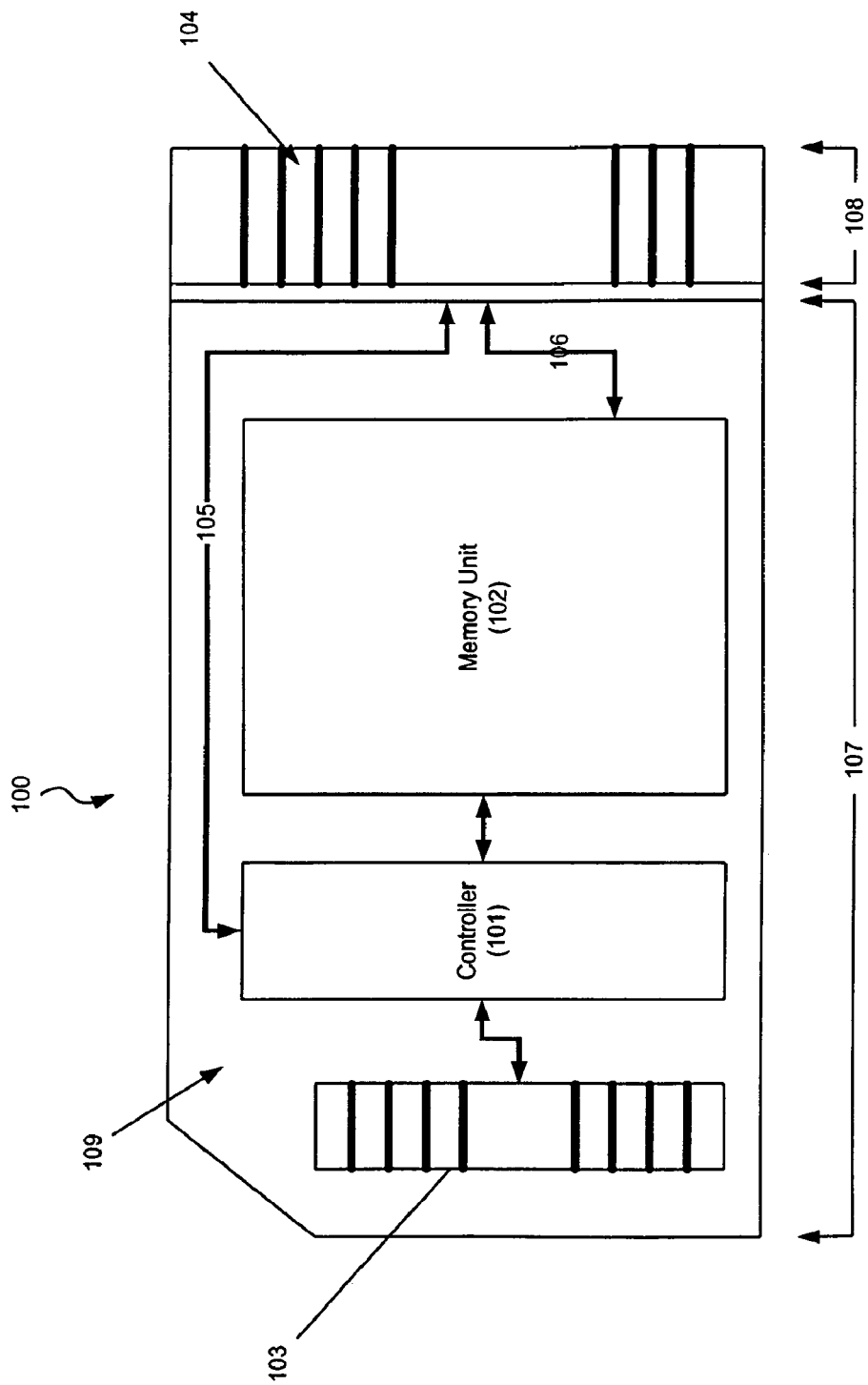
FIGS. 1a and 1b illustrate a conventional memory card at various stages of the manufacturing process.
Figure 1B:
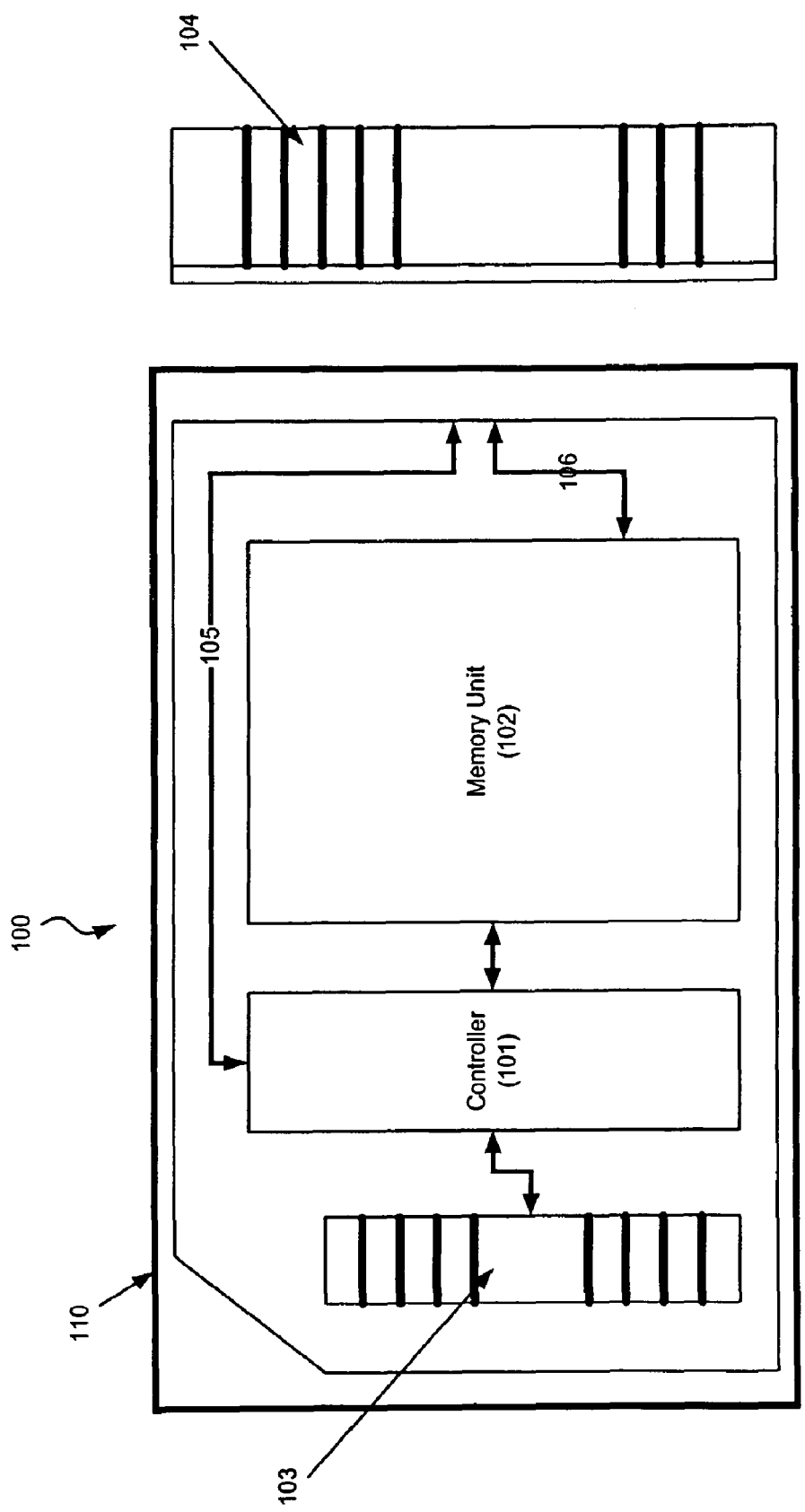
Figure 2:
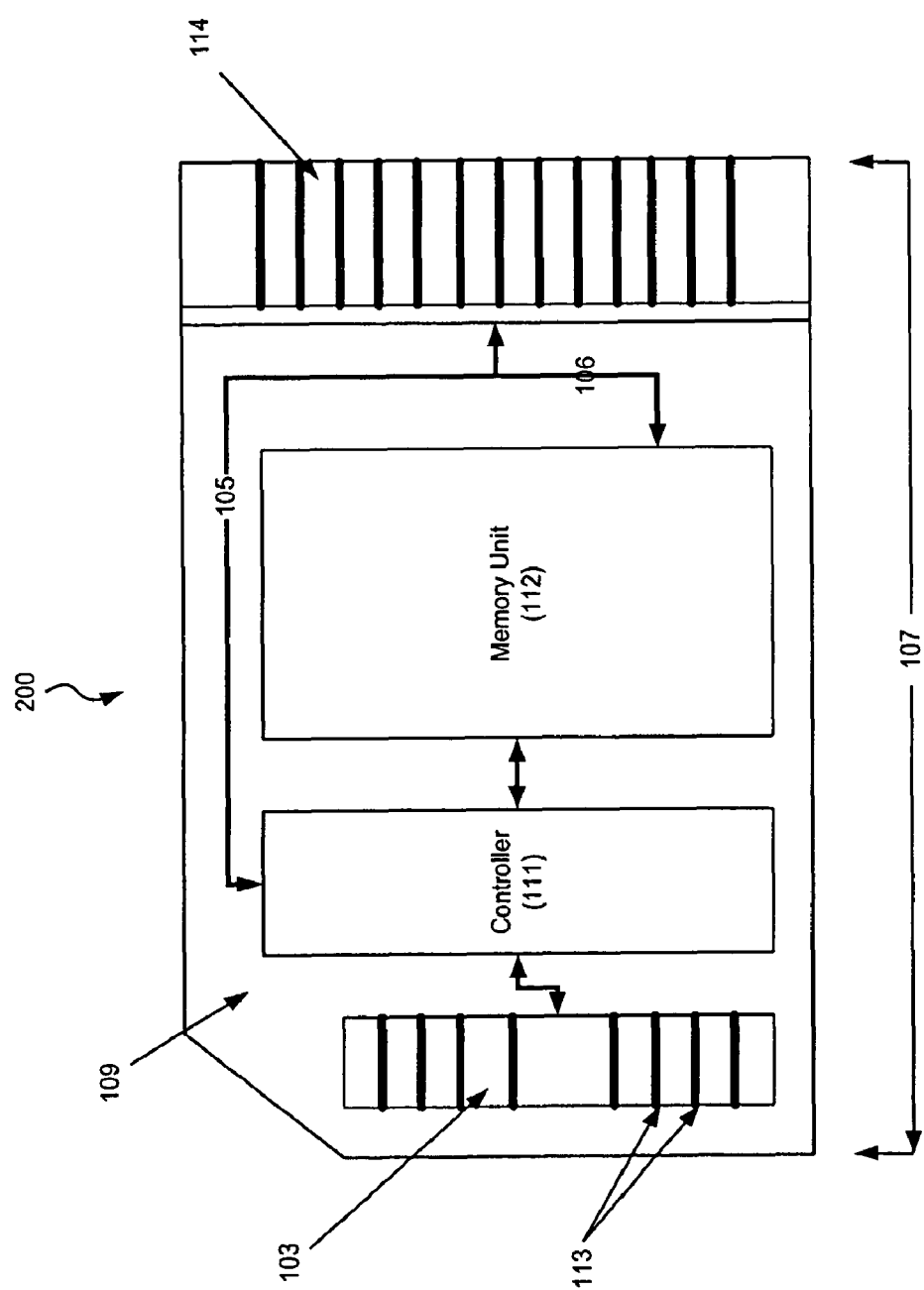
FIG. 2 illustrates an improved memory card according to the present invention without the card's skin.

FIG. 2 illustrates a preferred embodiment of an improved memory card according to the principles of the present invention. As shown in FIG. 2, the memory card (200) of the present invention includes a main interface (103), a controller (111) and a memory unit (112). The main components of the card (200), such as the controller (111) and the memory unit (112), may be referred to as dice (singular, "die"). These components may also be fabricated as separate chips and connected to the substrate (109) e.g., a printed circuit board, to form the card. Such chips are referred to as "Chips on Board" (COBs).

As before, the main interface (103) provides electrical access to the card (200) for the host device with which the card is used. In one embodiment, the main interface (103) includes seven, nine, 22, or 50 pins or electrical contacts (113) that can be connected to the data lines of the host device (not shown).

Typically, the card (200) is inserted in a slot in the host device which includes contacts or connectors for receiving the main interface (103). As noted above, memory cards can be used with, for example, digital cameras, music players (e.g., MP3 players), personal digital assistants, game machines, wireless telephones, digital voice recorders, printers and other computer peripherals. Memory cards can also be placed in adapters and interfaced with personal computers like other computer memory cards. Additional uses of memory cards are certain to be developed in the future, and the present invention is not limited to a particular application.

The memory unit (112) is not necessarily a singular device. The memory unit (112) can be composed of any number of discrete memory units. Additionally, consistent with the disclosure of U.S. Pat. Nos. 6,034,882 and 6,185,122, the memory unit (112) may be a multi-level memory device with memory arrays stacked vertically on the substrate (109).

In any event, the memory unit (112) is, under the principles of the present invention, reduced in size, but not necessarily capacity, so that it requires less of the area of the substrate (109) as compared to prior art devices. This reduction in size can be accomplished in several ways. For example, the memory capacity of the card (200) can be decreased. Preferably, the capacity of the card is maintained or increased and the memory unit (112) includes multiple vertically stacked memory layers. Additionally, there is an emerging technology that allows the mounting of one memory chip on top of another memory chip on a memory card. This may include components packaged in plastic packages and then soldered on the substrate (e.g., a printed circuit board), a chip-on-board which is a die attached and wire bonded to the substrate, a flip-chip assembly in which the die has bumped pads and is then soldered directly onto the substrate (e.g., a printed circuit board). Alternatively, as technology advances, memory devices may continue to shrink so that it becomes possible to put a single-layer memory unit of comparable capacity on less substrate area.

The present invention can be practiced under any of these circumstances in which the area required by the memory unit (112) is decreased. With the decrease in size of the memory unit (112), the substrate (109) is also shortened so as to bring the test interface (114) within the length (107) allowed by the applicable standard for a finished memory card. This is illustrated in FIG. 2.

Figure 3:
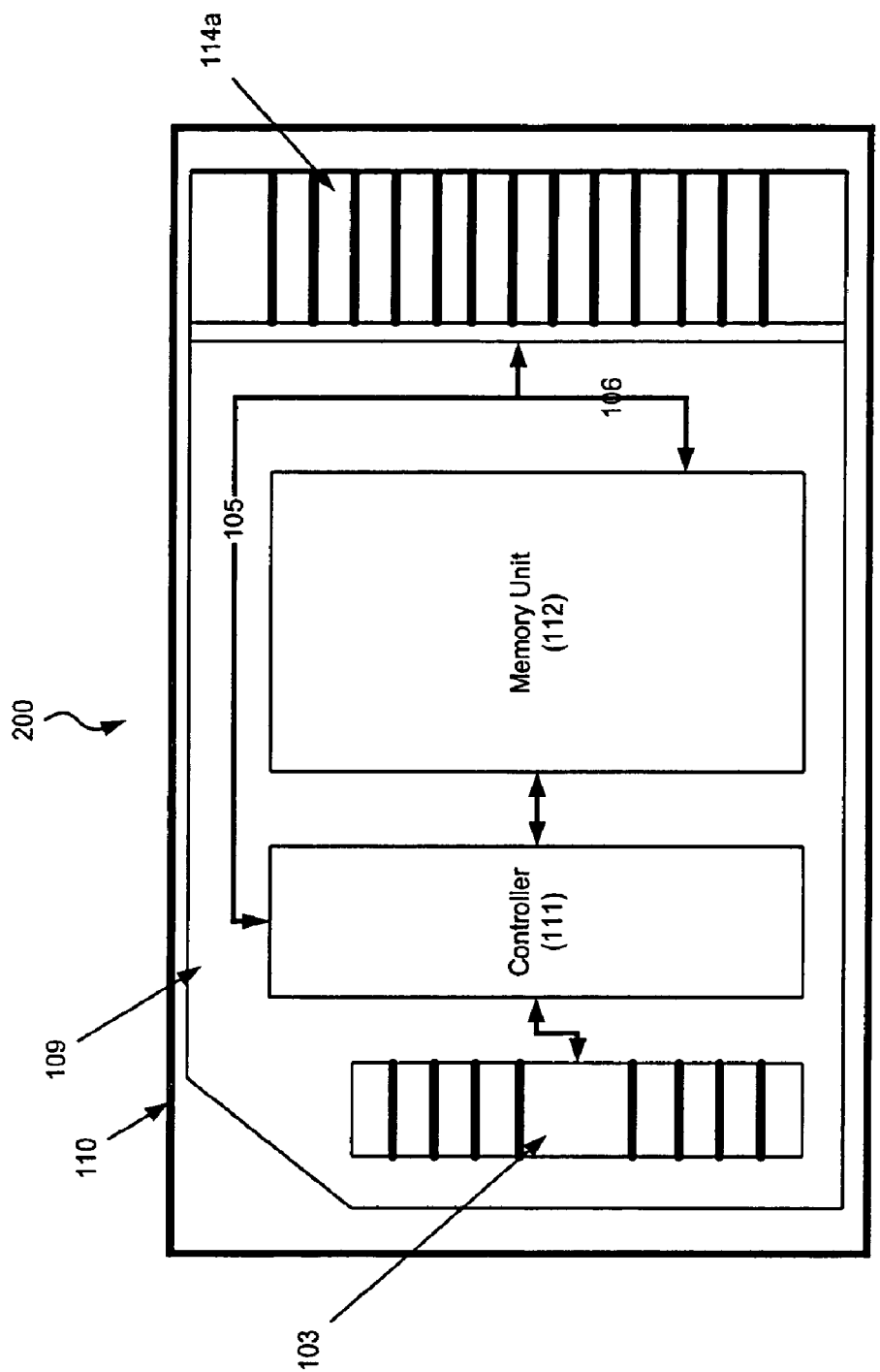
FIG. 3 illustrates the components of the card of FIG. 2 after the card has been encased in the skin.

FIG. 3 illustrates the memory card (200) of FIG. 2 after the components on the substrate (109) have been completely formed and the card (200) has been encased in a skin (110). As noted above, the skin (110) is a casing for the card that is typically made from metal or plastic. FIG. 4 also illustrates an assembled card (200), including the skin (110). As shown in FIG. 4, a surface (110a) of the skin (110) includes a window or opening through which the main interface (103) remains accessible to the device using the memory card (200).

Figure 4A:
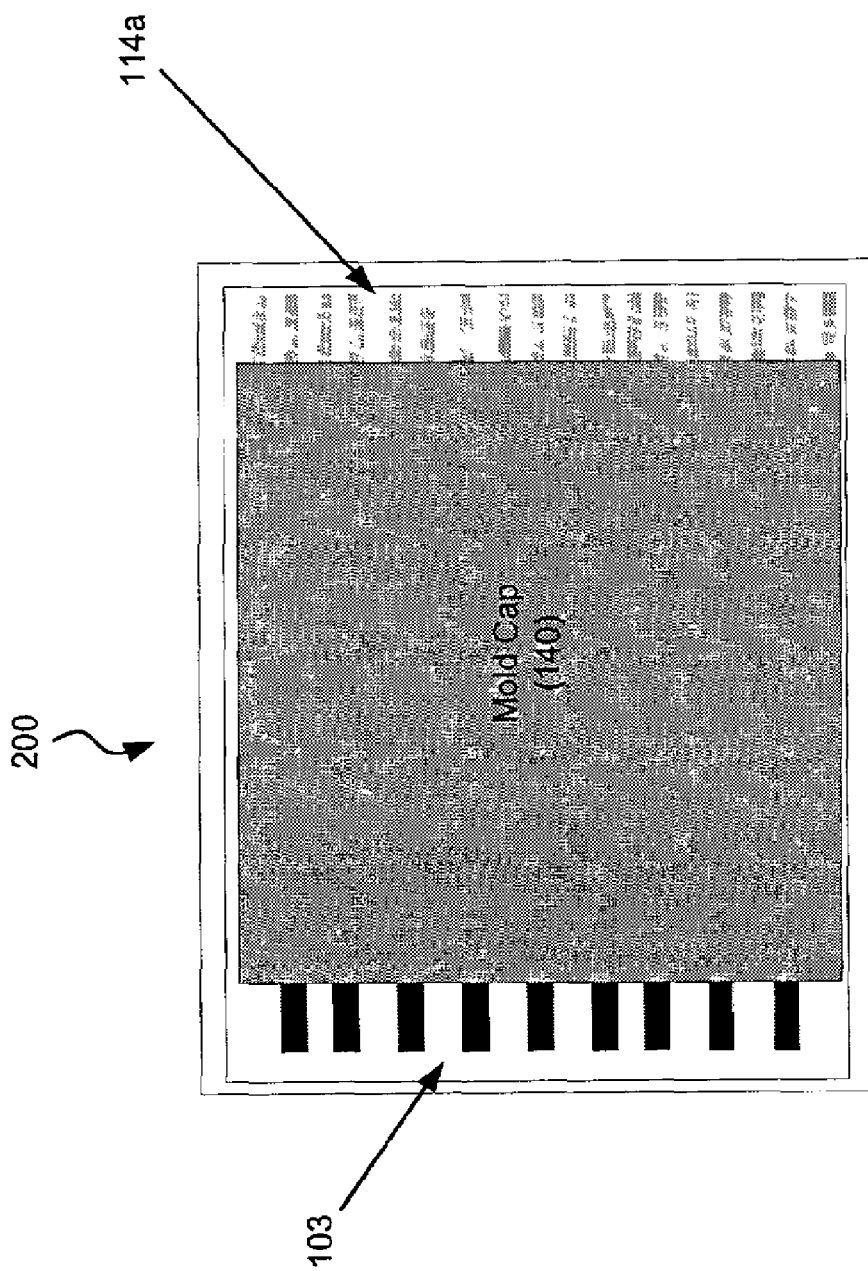
FIG. 4a illustrates the substrate of the memory card of FIG. 2 with the mold cap in place.

Before the card (200) is placed in the skin (110), completion of the card and some components of the card (200) may require that material be molded on the substrate (109). As this molding is performed, care is taken to ensure that the test interface (114) is not covered and rendered inaccessible. Consequently, as shown in FIG. 4a, the test interface protrudes from any molded material (e.g., the mold cap (140)) on the substrate (109) and is then referred to as edge connector (114a). The card (200) is then placed in the skin (110).

In the event of a failure of the card (200), particularly a field failure, the skin (110) can be opened and the edge connector (114a) accessed. With the edge connector (114a) accessible, the card (200) can be connected to the same test equipment used during manufacture. The memory unit (112) and controller (111) can be then directly accessed by the test equipment (not shown) using the connections (105 and 106) that will be described in more detail below. Consequently, the location and cause of the failure can be much more readily and accurately diagnosed than if only the main interface (103) were available to test the card (200). Thus, the present invention provides great advantages over the prior art in the ability to test a memory card (200) and, consequently, improve the manufacturing process based on the data revealed by the tests.

Figure 5:
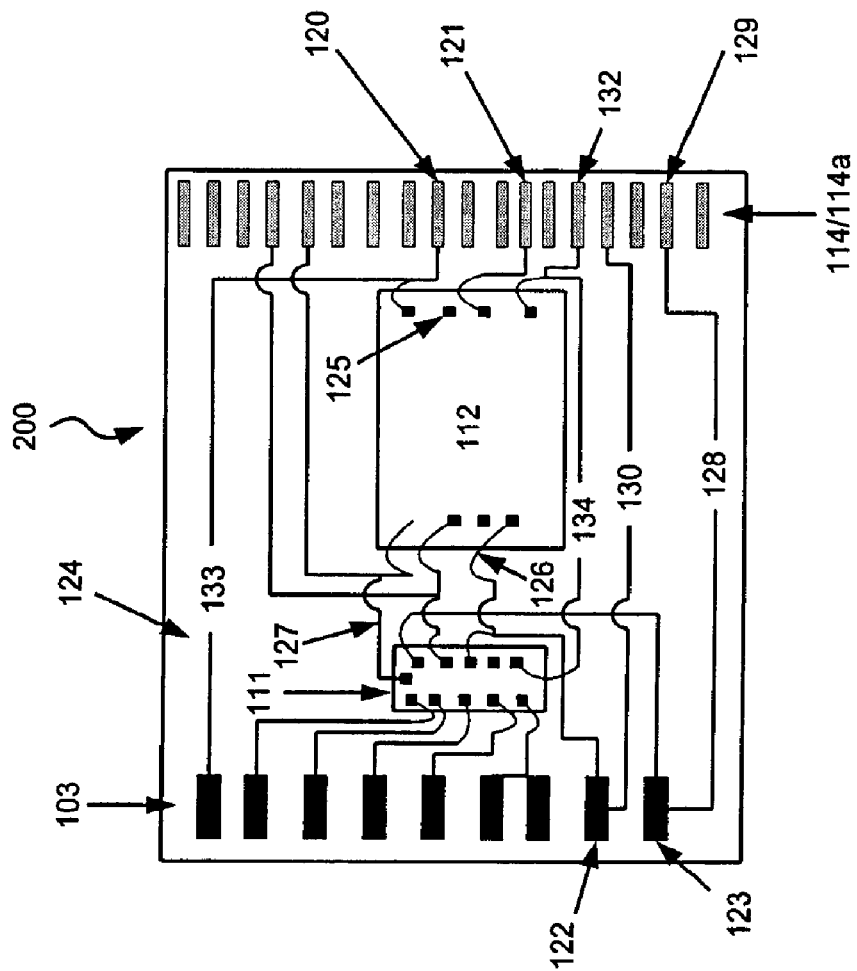
FIG. 5 provides a more detailed view of the components and the connections between components of a memory card according to the present invention.

FIG. 5 illustrates a preferred arrangement for the connections on the card (200) so as to maximize the usefulness of the edge connector (114a) during subsequent testing of the card (200). As shown in FIG. 5, there are connections (127) on the substrate, for example, printed connections on a printed circuit board (124). These connections (e.g., 127) are connected by wire, pin and or/solder (e.g., 126) to the electrical inputs (e.g., 125) of the dice, e.g., the controller (111) and memory unit (112). These connections (e.g., 127) typically provide links between the main interface (103) and the controller (111) and between the controller (111) and the memory unit (112).

Preferably, the pins or connectors (e.g., 123) of the main interface (103) may be connected (e.g., 128) to pins or connectors (e.g., 129) of the edge connector (114a). Consequently, the edge connector (114a) can be used to route signals through the main interface (103) as well as directly to other card components. In this way, the connections between the main interface (103) and the other card components (e.g., 111, 112) can be tested using the edge connector (114a).

Pin (122) of the main interface (103) is connected to both the controller (111) and the memory unit (112). This connection may provide power or ground for the dice (111, 112). Pin (122) is also connected (130) to the edge connector (114a) and can, therefore, be tested through the edge connector. Also power or grounding can be provided for the dice (111, 112) through the edge connector (114a) via the connection (130) during testing.

Pin (121) of the edge connector (114a) is connected directly to the memory unit (112) and illustrates that the edge connector (114a) can have such direct connections with the memory unit (112) to better test the memory unit (112). Pin (120) is also connected directly to the memory unit (112) at a location where the main interface (103) also connects directly to the memory unit (112). Where such is the case, pin (120) can also be used to test the reliability of any connection (e.g., 133) that runs directly between the main interface (103) and the memory unit (112).

Pin (132) of the edge connector (114a) is connected to a connection (134) that runs between the controller (111) and the memory unit (112). Consequently, pin (132) can be used to test the communication between the dice (111, 112) on connection.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims and all legal equivalents thereto.

What is claimed is:

1. A method of making a memory card comprising:
   attaching a memory array to a substrate;
   attaching a memory controller to said substrate;
   attaching a first interface to substrate, said first interface for connecting said memory card to a host device to allow access to said memory array through said memory controller;
   attaching a test interface to said substrate, said test interface is separate from said first interface; and
   enclosing said substrate of said memory card in a skin of said memory card without removing said test interface from said substrate.

2. The method of making a memory card of claim 1, wherein said memory array is a flash memory array.

3. The method of making a memory card of claim 1, further comprising forming at least one electrical connection between said test interface and said memory array.

4. The method of making a memory card of claim 1, further comprising forming at least one electrical connection between said memory controller and said test interface.

5. The method of making a memory card of claim 4, further comprising:
   forming a first electrical connection between said memory array and said memory controller; and
   forming a second electrical connection between said first electrical connection and said test interface.

6. The method of making a memory card of claim 1, further comprising forming at least one electrical connection between said first interface and said test interface.

7. The method of making a memory card of claim 1, further comprising: forming a first electrical connection between said first interface and said memory array; and
   forming a second electrical connection between said first electrical connection and said test interface.

8. The method of making a memory card of claim 1, wherein said first interface is compliant with a host interface of at least one of a Secure Digital memory card, a MultiMedia memory card (MMC), a SmartMedia memory card, a CompactFlash memory card, or a Memory Stick memory card.

9. The method of making a memory card of claim 1, wherein said enclosing said substrate of said memory card in a skin includes enclosing said substrate with said skin having an opening that exposes said first interface.

10. The method of making a memory card of claim 1, wherein said test interface is for testing said memory card for failures in the field.

11. The method of making a memory card of claim 1, wherein said test interface includes a connector for connecting to test equipment for testing said memory card.

12. The method of making a memory card of claim 1, wherein said memory card includes one or more edges, said test interface resides along at least one of said edges.

13. A method of making a memory card comprising enclosing a substrate of said memory card in a skin of said memory card, wherein said substrate enclosed by said skin comprises a memory unit, a main interface that provides external access to said memory unit, and a test interface that is separate from said main interface.

14. The method of claim 13, further comprising molding material on said substrate without covering said test interface to form an edge connector comprising said test interface.

15. The method of claim 13, further comprising forming at least one electrical connection running directly between said main interface and said test interface.

16. The method of claim 13, further comprising forming at least one electrical connection running directly between said test interface and said memory unit.

17. The method of claim 13, further comprising forming at least one direct connection between a controller on said substrate and said test interface.

18. The method of claim 13, further comprising forming at least one electrical connection running directly between said main interface and said memory unit, said at least one electrical connection also being electrically connected to said test interface.

19. The method of claim 13, further comprising forming at least one electrical connection running between said memory unit and a controller on said substrate, said electrical connection being also connected to said test interface.

20. The method of making a memory card of claim 13, wherein said test interface is for testing said memory card for failures in the field.

21. The method of making a memory card of claim 13, wherein said enclosing a substrate of said memory card in a skin includes enclosing said substrate with said skin having an opening that exposes said main interface.

22. A method of testing a memory card that includes a memory array on a substrate and a memory controller in communication with said memory array, said memory card has a skin that encloses said substrate, said memory array and said memory controller, said method comprising:
   opening said skin of said memory card to expose an edge connector on said substrate of said memory card, said edge connector is separate from a host connector that is for connecting said memory card to a host device, said edge connector is electrically connected to at least one of said memory controller and said memory array; and
   connecting said edge connector to test equipment for testing said memory card.

* * * * *